US010445288B2

(12) United States Patent
Chu

(10) Patent No.: US 10,445,288 B2
(45) Date of Patent: Oct. 15, 2019

(54) BUS ENCODING USING ON-CHIP MEMORY

(71) Applicant: QUALCOMM Incorporated, San Diego, CA (US)

(72) Inventor: Jeffrey Chu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 137 days.

(21) Appl. No.: 15/413,697

(22) Filed: Jan. 24, 2017

(65) Prior Publication Data

US 2018/0210858 A1  Jul. 26, 2018

(51) Int. Cl.
*G06F 15/78* (2006.01)
*G11C 7/10* (2006.01)
*G06F 13/42* (2006.01)
*G06F 1/3234* (2019.01)

(52) U.S. Cl.
CPC .......... *G06F 15/781* (2013.01); *G06F 1/3253* (2013.01); *G06F 13/4243* (2013.01); *G06F 13/4282* (2013.01); *G11C 7/1006* (2013.01); *G11C 7/1072* (2013.01); *Y02D 10/14* (2018.01); *Y02D 10/151* (2018.01)

(58) Field of Classification Search
CPC .. G06F 15/781; G06F 12/4282; G11C 7/1006
See application file for complete search history.

(56) References Cited

U.S. PATENT DOCUMENTS

| 2003/0128140 A1* | 7/2003 | Xie ........................ H03M 7/30 |
| | | 341/107 |
| 2006/0069879 A1 | 3/2006 | Inoue et al. |
| 2009/0193319 A1 | 7/2009 | Shen et al. |
| 2014/0089463 A1* | 3/2014 | Miller ..................... H04L 67/04 |
| | | 709/217 |

FOREIGN PATENT DOCUMENTS

WO    2012088464 A1    6/2012

OTHER PUBLICATIONS

Yasuura, Hiroto, et al, Energy Management Techniques for SOC design, Essential Issues in SOC design pp. 177-223 (Year: 2006).*
International Search Report and Written Opinion—PCT/US2017/062713—ISA/EPO—dated Feb. 7, 2018.

* cited by examiner

*Primary Examiner* — Ryan Bertram
*Assistant Examiner* — Edmund H Kwong
(74) *Attorney, Agent, or Firm* — Patterson & Sheridan, L.L.P.

(57) ABSTRACT

Various additional and alternative aspects are described herein. In some aspects, the present disclosure provides a method of communicating data between an electronic unit (EU) of a system-on-chip (SoC) and a dynamic random access memory (DRAM). The method includes encoding data at the EU. The method includes generating control data for decoding the encoded data at the EU. The method includes directing storage of the encoded data in the DRAM. The method includes directing storage of the control data in an on-chip memory separate from the DRAM, wherein the on-chip memory is on a same chip as the EU.

16 Claims, 8 Drawing Sheets

BUS ENCODING USING ON-CHIP MEMORY

TECHNICAL FIELD

The teachings of the present disclosure relate generally to transmission of data over buses and in particular embodiments to bus encoding using metadata and on-chip memory in system-on-chip (SoC) applications.

INTRODUCTION

An integrated circuit (e.g., SoC) may utilize on chip bus interconnections between electronic units (EU), which reside on the integrated circuit. Accordingly, EUs on integrated circuits may be coupled to each other by buses. A "bus" may include a signal conductor or a plurality of conductors used to couple EUs and transfer data (e.g., bits) between EUs. An "electronic unit" may include electronic circuitry, which is coupled to other electronic circuitry by one or more buses. For example, an EU may be a microprocessor, a computer, a floating point co-processor, a graphics processing unit (GPU), an intellectual property (IP) core, processing unit, memory, controller, etc. An EU may be coupled to another EU by a data bus.

A SoC may include a plurality of EUs coupled by one or more buses. Such interconnected systems may resemble a quilt with different fabric pieces interconnected by stitches, hence a common term to describe such an interconnected system is "fabric."

Reduction of power consumption is a common goal for electronic systems. For example, transmission of data across buses between components of the electronic system may consume power. Reducing such power consumed in the transmission of data across buses may therefore reduce power consumption overall in the electronic system. For example, reducing the power utilized for transmission of data over buses in system-on-chip (SoC) applications, may reduce the overall power consumed by the SoC.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In some aspects, the present disclosure provides a method of communicating data between an electronic unit (EU) of a system-on-chip (SoC) and a dynamic random access memory (DRAM). The method includes encoding data at the EU. The method includes generating control data for decoding the encoded data at the EU. The method includes directing storage of the encoded data in the DRAM. The method includes directing storage of the control data in an on-chip memory separate from the DRAM, wherein the on-chip memory is on a same chip as the EU.

In some aspects, the present disclosure provides an electronic unit (EU) of a system-on-chip (SoC). The EU includes a bus encoding component configured to encode data and generate control data for decoding the encoded data. The EU further includes a bus protocol conversion component configured to direct storage of the encoded data in a dynamic random access memory (DRAM). The bus protocol conversion component is further configured to direct storage of the control data in an on-chip memory separate from the DRAM, wherein the on-chip memory is on a same chip as the EU.

In some aspects, the present disclosure provides an electronic unit (EU) of a system-on-chip (SoC). The EU includes means for encoding data at the EU. The EU further includes means for generating control data for decoding the encoded data at the EU. The EU further includes means for directing storage of the encoded data in the DRAM. The EU further includes means for directing storage of the control data in an on-chip memory separate from the DRAM, wherein the on-chip memory is on a same chip as the EU.

In some aspects, the present disclosure provides a computer readable medium having instructions stored thereon for causing an electronic unit (EU) of a system-on-chip (SoC) to perform a method of communicating data between the EU and a dynamic random access memory (DRAM). The method includes encoding data at the EU. The method includes generating control data for decoding the encoded data at the EU. The method includes directing storage of the encoded data in the DRAM. The method includes directing storage of the control data in an on-chip memory separate from the DRAM, wherein the on-chip memory is on a same chip as the EU.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Although the teachings of this disclosure are illustrated in terms of integrated circuits (e.g., a SoC), the teachings are applicable in other areas. The teachings disclosed should not be construed to be limited to SoC designs or the illustrated embodiments. The illustrated embodiments are merely vehicles to describe and illustrate examples of the inventive teachings disclosed herein.

Figure 1:
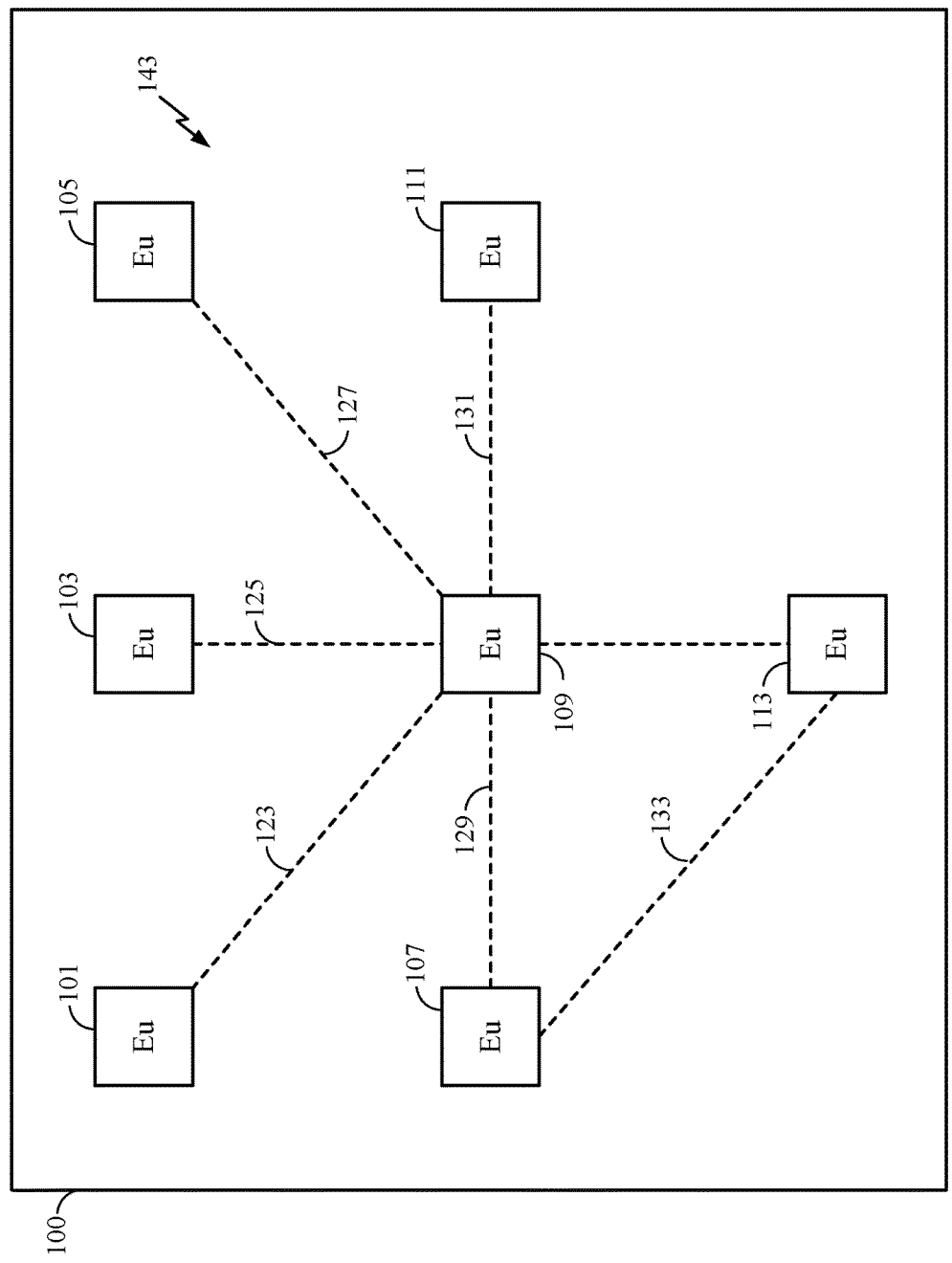
FIG. 1 is an illustration of an exemplary integrated circuit employing a system-on-chip (SoC) interconnection fabric, in accordance with certain aspects of the present disclosure.

FIG. 1 is an illustration of an exemplary integrated circuit 100 employing a SoC interconnection fabric 143, in accordance with certain aspects of the present disclosure. The illustrative fabric 143 includes EUs 101-113 coupled by buses 123-133.

Buses 123-133 transmit and receive data in discrete chunks comprising one or more bits between EUs 101-113. A bus transaction may communicate successive chunks of data in sequence. Each chunk of data in a bus transaction may be referred to as a beat. A beat is the smallest indivisible transmission of data across a bus. Each beat may transfer one or more bits of information, depending on the bus configuration.

In some aspects, EUs may be coupled together by separate buses or shared buses.

Figure 2:
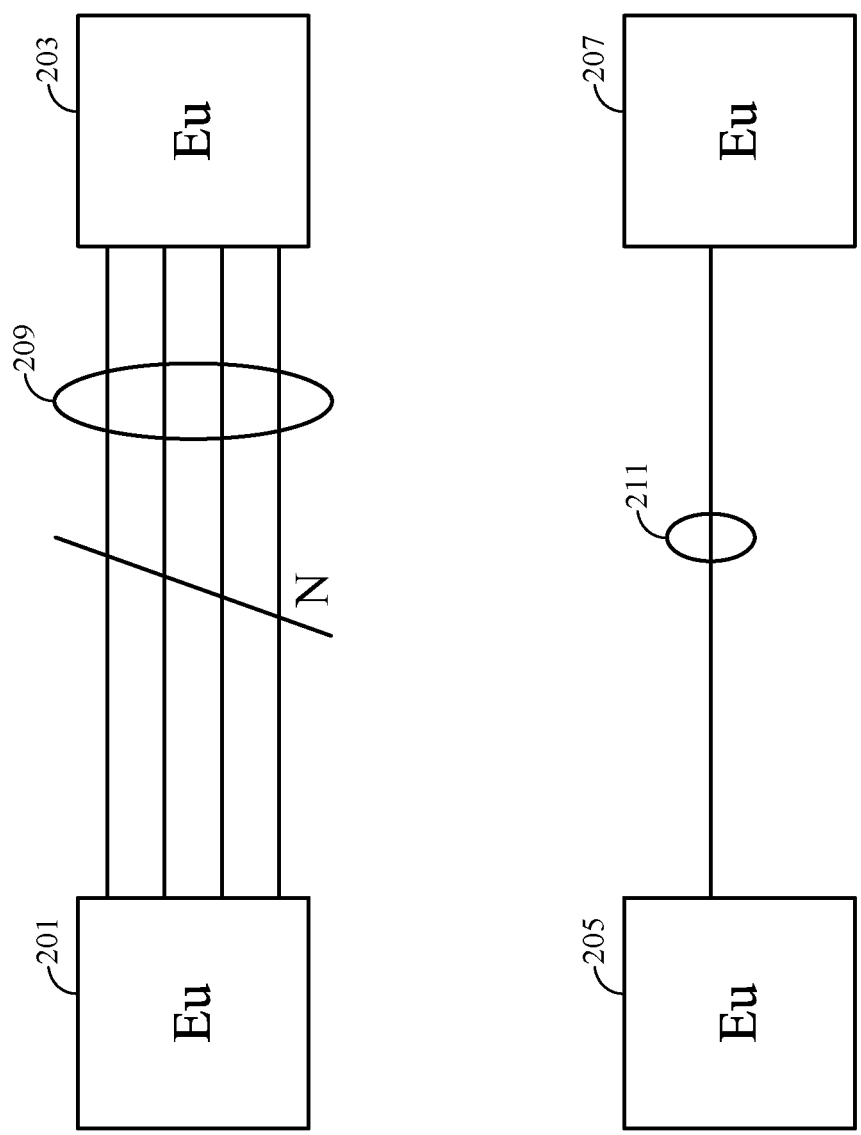
FIG. 2 is an illustration of serial and parallel bus configurations, in accordance with certain aspects of the present disclosure.

FIG. 2 is an illustration of serial and parallel bus configurations, in accordance with certain aspects of the present disclosure. For example, bus 209 illustrates a parallel bus configuration between EUs 201 and 203. Bus 209 as shown includes N conductors. In some aspects, each conductor can communicate one bit per beat. Accordingly, the N conductors between EUs 201 and 203 can communicate N bits per beat (e.g., an N bit word). In some aspects, though not shown, the bus 209 may include additional conductors between EUs 201 and 203 to communicate other information (e.g., control information, metadata, etc.).

Bus 211 illustrates a serial configuration between EUs 205 and 207. Bus 211 as shown includes a single conductor. Accordingly, the conductor between EUs 205 and 207 can communicate one bit per beat. Data transmitted across such serial buses commonly comprises a plurality of beats where bits are transmitted serially. In some aspects, though not shown, the bus 211 may include additional conductors between EUs 205 and 207 to communicate other information (e.g., control information, metadata, etc.).

The teachings herein may apply to both parallel and serial bus configurations, as well as variations thereof. For the sake of clarity, and to avoid unnecessary obfuscations of the teachings herein, common structures have been omitted. Throughout this disclosure common and well known structures not necessary for the understanding of the teachings herein are also omitted so that the inventive teachings herein are not obscured.

Figure 3:
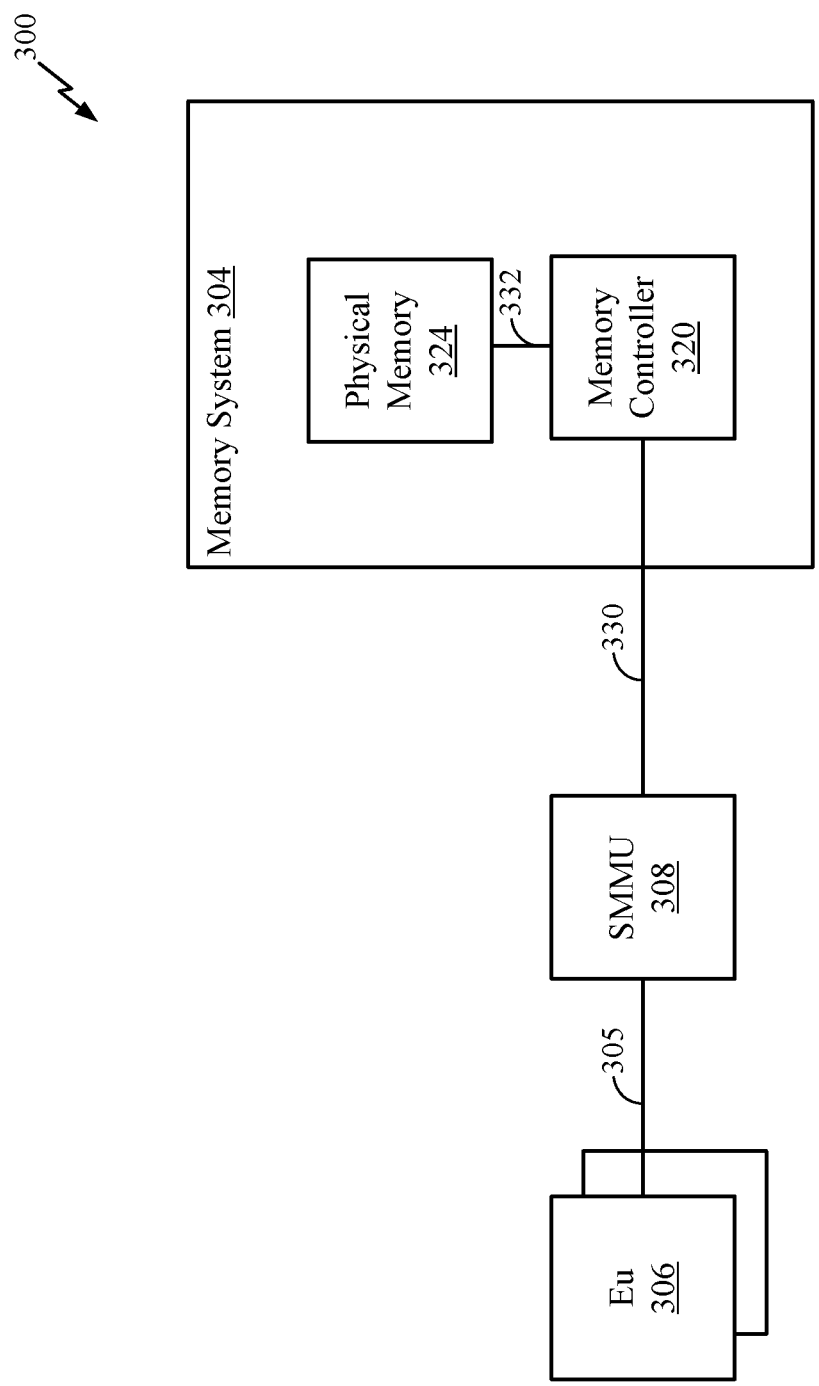
FIG. 3 illustrates a system including a memory system for communicating data between an electronic unit (EU) (e.g., of a system-on-chip (SoC)) and a physical memory, in accordance with certain aspects of the present disclosure.

FIG. 3 illustrates a system 300 including a memory system 304 (e.g., dynamic random access memory (DRAM) system, such as a double data rate (DDR) DRAM system), in accordance with certain aspects of the present disclosure. The system 300 may be implemented in any computing device, including a personal computer, a workstation, a server, a portable computing device (PCD), such as a cellular telephone, a portable digital assistant (PDA), a portable game console, a palmtop computer, or a tablet computer. One or more components of the system 300 may be implemented on an integrated circuit (e.g., SoC).

As shown, the system 300 comprises various on-chip components, including one or more EUs 306 that may access (e.g., read/write) memory resources of the memory system 304. The EUs 306, as discussed, may comprise one or more processing units (e.g., central processing unit (CPU), graphics processing unit (GPU), digital signal processor (DSP), display processor, etc.), a video encoder, an intellectual property (IP) core, or other clients requesting read/write access to the memory system 304. The EUs 306 may be coupled to each other via one or more buses. Further, one or more of the EUs 306 are coupled to a system memory management unit (SMMU) 308 via a bus 305. For example, one or more EUs 306 may share a bus 305 to communicate with the SMMU 308, or some EUs 306 may be coupled via separate buses to the SMMU 308. Further, in some aspects, one or more EUs 306 may share the bus 305 to communicate with each other.

The SMMU 308 is coupled to memory controller 320 (e.g., DRAM controller, DDR controller, etc.). The SMMU 308 may be coupled to the memory controller 320 by the bus 330, which may be different than or the same as bus 305. The memory controller 320 may further be coupled to the physical memory 324 (e.g., DRAM, DDR RAM, etc.). The memory controller 320 may be coupled to the physical memory 324 by the bus 332, which may be different than or the same as bus 305 or bus 330.

EUs 306 may access the physical memory 324 via the SMMU 308 and the memory controller 320. For example, the SMMU 308 may provide a virtual memory to the EU 308 that allows the EU 308 to access a contiguous virtual memory address space for each process (e.g., software program, function, etc.) running on the EU 308 instead of directly accessing a physical memory address space, which may be fragmented or disjointed. For example, an EU 306 may generate a read/write command and send the command as a bus transaction to the SMMU 308 on the bus 305.

The SMMU 308 may translate the virtual memory address (VA) identified in the bus transaction received from the EU 306 and translate the VA to a physical memory address (PA)

of the physical memory 324. The SMMU 308 may send a modified bus transaction corresponding to the bus transaction from the EU 306 to the memory controller 320 on the bus 330. The modified bus transaction may include the PA of the physical memory 324 instead of the VA of the original bus transaction from the EU 306. The memory controller 320 may handle the physical signaling and communication with the physical memory 324 to read/write data according to the modified bus transaction. For example, the memory controller 320 may contain the logic needed to read and write to the physical memory 324 and refresh the physical memory 324. The memory controller 320 may communicate with the physical memory 324 on the bus 332 to read/write data according to the bus transaction received from the SMMU 308.

The physical memory 324 may further send data (e.g., based on a read command) to the memory controller 320, which may send data to the SMMU 308, which may further send data to the EU 306.

Figure 3A:
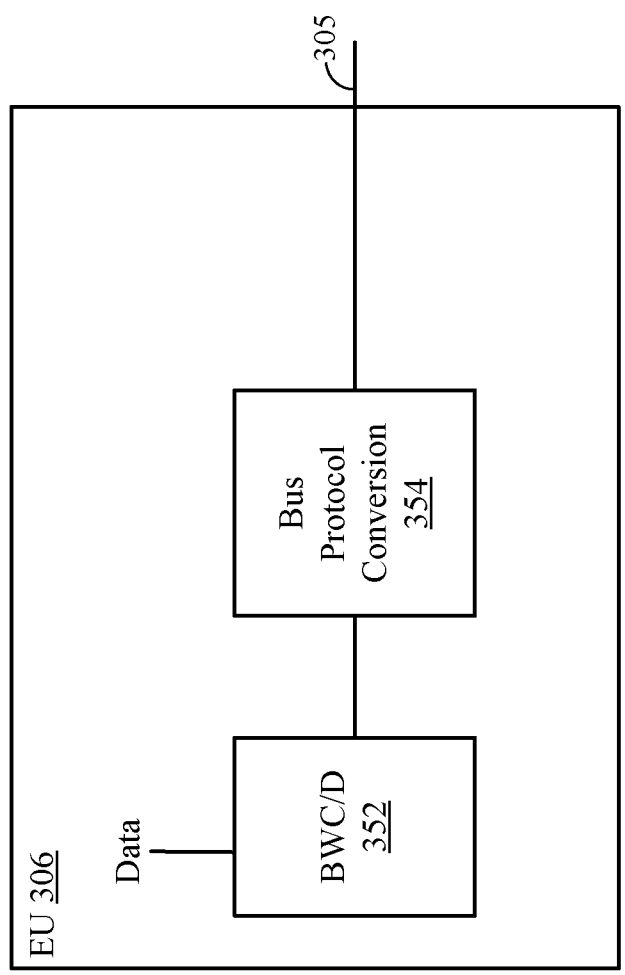
FIG. 3A illustrates a block diagram of an example of an EU of FIG. 3, in accordance with certain aspects of the present disclosure.

FIG. 3A illustrates a block diagram of an example of an EU 306 (e.g., GPU), in accordance with certain aspects of the present disclosure. The EU 306 may be configured to utilize bandwidth compression/decompression (BWC/D) to reduce the bandwidth needed to transmit data on the buses between components of the system 300. For example, the EU 306, as shown, includes a BWC/D component 352 configured to apply bandwidth compression to data (e.g., image data) to reduce the bandwidth (e.g., size) of the data. The BWC/D component 352 may further be configured to decompress compressed data. The BWC/D component 352 may be implemented in hardware or software of the EU 306. Further, though the BWC/D component 352 is shown as a single element, in some aspects, the BWC/D component 352 may comprise separate components for compression and decompression (e.g., a bandwidth compression (BWC) component and a bandwidth decompression (BWD) component, respectively). Further, in some aspects, an EU 306 may include only one of the BWC and BWD components. By reducing the size of the data communicated over the buses and stored in memory, the power consumption of the system 300 may be reduced. For example, the bus power and memory power required to perform data writes may be reduced as fewer bits are transferred on the bus and written to the memory. Further, since the data stored in the memory is compressed, the number of bits read from the memory may also be reduced, therefore reducing the power required for a data read.

For example, the EU 306 may have data to write to the physical memory 324. The BWC/D component 352 may apply a compression technique (e.g., tile based compression scheme for image data divided into tiles) to the data to write to the physical memory 324. The BWC/D component 352 may pass the compressed data to a bus protocol conversion component 354. The bus protocol conversion component 354 may be implemented in hardware or software of the EU 306. The bus protocol conversion component 354 is configured to convert the compressed data to a bus transaction and send the data as a bus transaction to the SMMU 308 for further communication to the physical memory 324 as described herein. In some aspects, where the data comprises a tile of image data, the writing of the compressed tile may correspond to a single bus transaction to the SMMU 308.

In addition to transmitting the actual compressed data to the SMMU 308, the bus protocol conversion component 354 may communicate the address information (e.g., VA) of where to write the compressed data to the SMMU 308 over the bus 305. Further, the bus protocol conversion component 354 may send metadata about the compressed data to the SMMU 308 along with address information (e.g., VA) of where to write the metadata to the SMMU 308 over the bus 305. In some aspects, the bus protocol conversion component 354 may send the metadata to the SMMU 308 in a different bus transaction than the compressed data. The metadata my include information used for decompressing the compressed data. For example, the metadata may include an indication of the type of compression applied, a size of the data before compression, a size of the compressed data, header information, etc.

In some aspects, the same or another EU 306 may read the compressed data from the physical memory 324. In particular, as discussed, the bus protocol conversion component 354 may generate a bus transaction corresponding to a read command of compressed data (e.g., a single bus transaction to read a single compressed tile from the physical memory 324). The bus transaction may further indicate a VA of the compressed tile. The bus protocol conversion component 354 may send the bus transaction to the SMMU 308 over the bus 305. The bus protocol conversion component 354 may further generate a separate bus transaction corresponding to a read command of the metadata associated with the compressed data. The bus transaction may further indicate a VA of the metadata. The bus protocol conversion component 354 may send the bus transaction to the SMMU 308 over the bus 305

The SMMU 308 may further communicate over the bus 330 with the memory controller 320, which may communicate over the bus 332 with the physical memory 324. The memory controller 320 may receive the compressed data and corresponding metadata from the physical memory 324 over bus 332 (e.g., as separate bus transactions). The memory controller 320 may send the compressed data and corresponding metadata to the SMMU 308 over bus 330 (e.g., as separate bus transactions). The SMMU 308 may send the compressed data and corresponding metadata to the EU 306 over bus 305 (e.g., as separate bus transactions). The bus protocol conversion component 354 may convert the bus transaction(s) to the compressed data and metadata and pass the compressed data and metadata to the BWC/D component 352. The BWC/D component 352 may decompress the compressed data based on the corresponding metadata to retrieve the original data (e.g., tile data).

In some aspects, the EU 306, in addition to compressing data for transmission over buses 305, 330, and 332 and storage in the physical memory 324, may encode the compressed data to further reduce power consumption for communicating the data over the buses 305, 330, and 332.

In some aspects, the EU 306 may encode the compressed data to reduce a number of state transitions between bits of the compressed data transferred along the buses 305, 330, and 332. Changing the state of a data bit on a particular bus conductor may consume more power than transmitting the same bit successively. Accordingly, reducing the number of state transitions between successively communicated bits along the buses 305, 330, and 332 reduces power consumption. Therefore, in some aspects, the EU 306 encodes the compressed data so that the transitions of the data bits in successive beats of the bus transactions along the buses 305, 330, and 332 exhibit the minimum cumulative Hamming distance between all the successive data bits of the bus transactions (e.g., corresponding to the compressed data, metadata, etc.).

For example, when the same data bit value is transmitted twice, the value of that data bit is maintained and power is not lost switching between states. Simply put, for the sake of illustration, transmitting two successive "1" values over a bus takes less power than transmitting a "1" value followed by a "0" value because to transmit a "1" followed by a "0" consumes power in switching states from a "1" to a "0". The total number of transitions on each data bus conductor, added up over all the conductors in the bus and all the data transmitted, may be designated as the Hamming distance of the data. The smallest number for the Hamming distance of the data to be transmitted may generally result in the fewest bus transitions and the least power used.

In some aspects, the Hamming distance of a transmission may not be the only factor considered for encoding the compressed data. A value of one state on a bus may consume more power than the value of another state on a bus. As an example, assume that a one-bit serial bus is transmitting an 8 beat message containing 8 bits. Further assume that maintaining a "1" state consumes 20% more power than maintaining a "0" state, for example due to leakage. Transmitting a data sequence of 1, 0, 0, 0, 0, 0, 0, 0 will consume less power than transmitting 0, 1, 1, 1, 1, 1, 1, 1 even though the Hamming distance is the same for both sequences. Consideration of the power to maintain a particular state on a bus may be referred to as weighting or weighing. Accordingly, in some aspects, the EU 306 may encode the compressed data based on the weighting of the data communicated, in addition or in alternative to encoding the compressed data based on the Hamming distance.

For example, the EU 306 may use weighted bus invert coding to encode the compressed data. In weighted bus invert coding an extra bit (e.g., bus invert bit) may be used to indicate if the data on the bus has been inverted or not. For example, 1, 0, 0, 0, 0, 0, 0, 0 transmitted in a first beat followed by 0, 1, 1, 1, 1, 1, 1, 1 transmitted in a second beat, could be transmitted as 1, 0, 0, 0, 0, 0, 0, 0 (bus invert=0, i.e. not inverted) followed by 1, 0, 0, 0, 0, 0, 0, 0 (bus invert=1, i.e. inverted). In such a case, only one bit (the bus invert bit) would switch instead of having 8 bits switch state. Further, in weighted bus invert coding the fact that a 1 state consumes more power than a 0 state would be taken into account and the pattern 1, 0, 0, 0, 0, 0, 0, 0 would be preferred over the pattern 0, 1, 1, 1, 1, 1, 1, 1, which will consume more energy in transmission due to the weighting of the power in the different states.

In some aspects, to implement the encoding of the compressed data (e.g., based on the Hamming distance, weighting, or other power reduction schemes), the components of the system 300 may need to pass additional control data (e.g., control information) for interpreting (e.g., decoding) the encoded compressed data. For example, the control data may indicate whether bus encoding has been applied on the transaction, whether encoding has been applied to a particular beat of the bus transaction, the type of encoding applied, reordering of the words in the transaction, etc.

In some aspects, such control data cannot be passed as part of the bus transaction, but instead needs to be passed as sideband signaling between the components of the system 300 (e.g., the EU 306, the SMMU 308, and the memory controller 320) along the path the compressed data and metadata is communicated. Such sideband signaling may occur over additional conductors between each of the components of the system 300. Such additional conductors may utilize additional die space for implementing the system 300, and further utilize additional power consumption for passing the sideband signals.

In addition, the physical memory 324 may not be configured to utilize the control data or store the control data since it is not configured to handle sideband signaling. Accordingly, the memory controller 320 may decode the encoded data and then store only the compressed data (i.e., not encoded) in the physical memory 324. Accordingly, when a read operation of the compressed data is performed, the compressed data passed between the components of the system 300 (e.g., physical memory 324, memory controller 320, SMMU 308, EU 306, etc.) may not be encoded and therefore may not have reduced power consumption for communicating the data between the components along the buses 305, 330, and 332.

Compression of data may be different from encoding of data as described herein. In particular, compression of data may refer to reducing the number of bits utilized to represent the data, but does not specifically account for how the particular arrangement or value of bits would affect power consumption when transferred over a bus or stored in memory. Encoding of data may refer to substituting a bit pattern for another bit pattern, even if the substitute bit pattern has the same, fewer, or a greater number of bits than the original bit pattern. In particular, encoding (e.g., based on the Hamming distance, weighting, or other power reduction schemes) of data, as discussed herein, reduces power for communicating the data over a bus. Such encoding may be referred to as bus encoding.

Certain aspects of the disclosure provide systems and methods for implementing bus encoding using metadata. In particular, as discussed above, data (e.g., tile data) to be communicated over a bus may be compressed and metadata for decompressing the compressed data may be generated by an EU. The compressed data and metadata may be communicated and stored by an EU to a physical memory, as discussed. Further, the EU may apply encoding to the compressed data (e.g., and metadata) communicated and stored. In certain aspects, control data regarding how the compressed data is encoded may be transmitted along with the compressed data for the compressed data to be properly decoded. Accordingly, in certain aspects, systems and methods herein relate to placing control data related to the encoding in the metadata corresponding to the compressed data.

By placing control data related to the encoding in the metadata corresponding to the compressed data, the control data may be communicated over the buses between components of a system instead of utilizing additional sideband signaling. Accordingly, additional conductors are not needed for such sideband signaling. Further, since the control data is part of the metadata, and the metadata is written to the physical memory, the encoded data can be written to the physical memory, instead of a memory controller having to decode the data and write decoded data to the physical memory. Communicating encoded data between the memory controller and the physical memory can reduce the power consumption for communicating the data between the memory controller and the physical memory. Further, writing encoded data to the physical memory may reduce a number of toggles of the physical memory for storing data in the memory, and therefore reduce the power consumption for storing the data in the physical memory. In addition, when the data is read from the physical memory, it is still encoded and therefore the power consumption for communicating the encoded data in a read transaction between components of the system is also reduced.

Figure 3B:
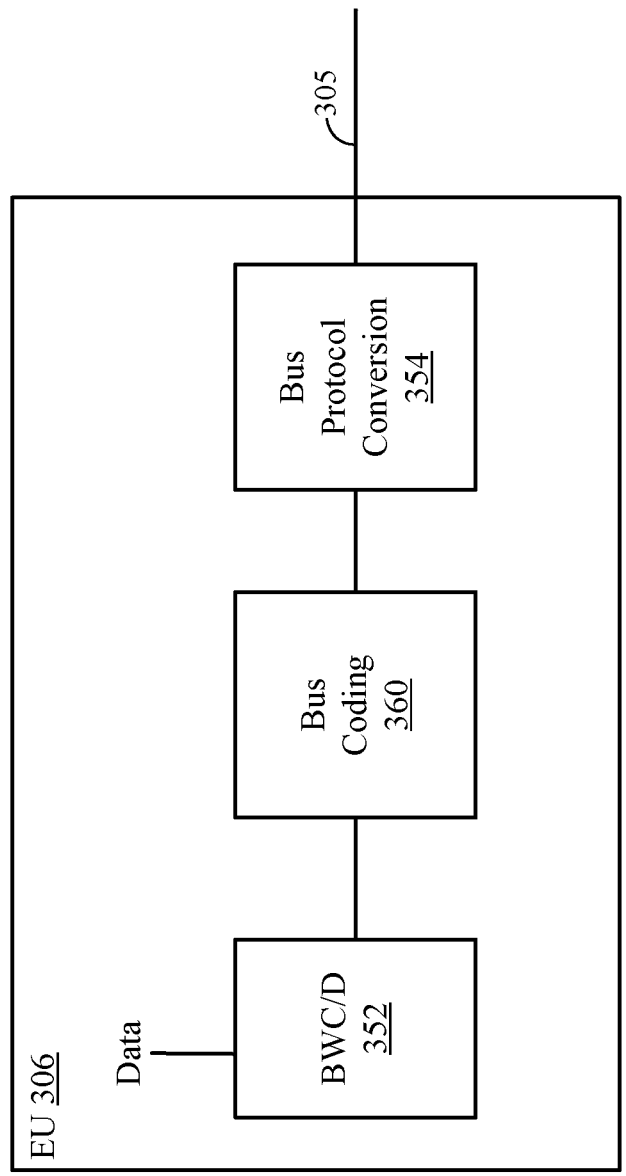
FIG. 3B illustrates a block diagram of an example of an EU of FIG. 3 configured to place control data related to encoding of compressed data in the metadata corresponding to the compressed data, in accordance with certain aspects of the present disclosure.

FIG. 3B illustrates a block diagram of an example of an EU 306 (e.g., GPU) configured to place control data related to encoding of compressed data in the metadata corresponding to the compressed data, in accordance with certain aspects of the present disclosure. In other words, the metadata includes the control data. As shown, the EU 306 of FIG. 3B is similar to the EU 306 of FIG. 3A. However, the EU 306, in addition to the BWC/D component 352 and the bus protocol conversion component 354, further includes a bus coding component 360. The bus coding component 360 may be configured to apply bus encoding to data (e.g., compressed data) from the BWC/D component 352. The bus coding component 360 may further be configured to decode encoded data (e.g., compressed data). Though the bus coding component 360 is shown as a single element, in some aspects, the bus coding component 360 may comprise separate components for encoding and decoding (e.g., a bus encoding component and a bus decoding component). Further, in some aspects, an EU 306 may include only one of the bus encoding component and the bus decoding component. The bus coding component 360 may then pass the encoded compressed data to the bus protocol conversion component 354 for further communication with each of the SMMU 308, memory controller 320, and physical memory 324 over buses 305, 330, and 332, respectively. The bus coding component 360 may further be configured to decode encoded data received as part of a read transaction. In some aspects, each of the SMMU 308 and memory controller 320 may further be configured to read the control data placed in the metadata to interpret the encoded compressed data.

For example, the EU 306 may have data to write to the physical memory 324. The BWC/D component 352 may apply a compression technique (e.g., tile based compression scheme for image data divided into tiles) to the data to write to the physical memory 324. The BWC/D component 352 may pass the compressed data to the bus coding component 360. The bus coding component 360 may encode the compressed data (e.g., utilizing bus encoding, such as described herein). The bus coding component 360 may further generate control data for interpreting/decoding the encoded compressed data. The bus coding component 360 further passes the control data and encoded compressed data to the bus protocol conversion component 354.

The bus protocol conversion component 354 is configured to convert the encoded compressed data to a bus transaction and send the data as a bus transaction to the SMMU 308 for further communication to the physical memory 324 as described herein. In addition to transmitting the actual encoded compressed data to the SMMU 308, the bus protocol conversion component 354 may communicate the address information (e.g., VA) of where to write the encoded compressed data to the SMMU 308 over the bus 305.

Further, the bus protocol conversion component 354 may generate and send metadata about the encoded compressed data to the SMMU 308 along with address information (e.g., VA) of where to write the metadata to the SMMU 308 over the bus 305. The bus protocol conversion component 354 includes the control data for decoding the encoded compressed data received from the bus encoding component 360 in the metadata generated and sent to the SMMU 308.

In some aspects, the metadata may include an indication of the size of the compressed data. Further, the control data included in the metadata may include an indication of which beats of the bus transaction corresponding to the compressed data are encoded or not. For example, the metadata may comprise 8 bits. In some aspects, the 8 bits are defined as follows: 1 bit indicating the size of the compressed data (e.g., is it compressed or not), and 7 bits indicating whether or not each of the last 7 beats of the transaction are encoded or not. Additionally or alternatively, the metadata may include an indication of the type of compression applied, a size of the data before compression, a size of the compressed data, header information, etc. Additionally or alternatively, the control data may include an indication of whether bus inversion has been used for encoding, whether encoding has been applied to a particular beat of the bus transaction, a type of encoding applied, etc. In some aspects, the bus protocol conversion component 354 may send the metadata to the SMMU 308 in a different bus transaction than the compressed data over the bus 305. The metadata my include information used for decompressing the compressed data.

In some aspects, the SMMU 308 may utilize the control data in the metadata to interpret the encoded compressed data. The SMMU 308 may further translate the VA for storing the encoded compressed data to a PA in the physical memory 324. The SMMU 308 may further communicate the encoded compressed data and the metadata to the memory controller 320 over the bus 330. In some aspects, the memory controller 320 may utilize the control data in the metadata to interpret the encoded compressed data. The memory controller 320 may communicate the encoded compressed data and metadata to the physical memory 324 and direct storage of the encoded compressed data and metadata in the physical memory 324.

In some aspects, the same or another EU 306 may read the encoded compressed data from the physical memory 324. In particular, as discussed, the bus protocol conversion component 354 may generate a bus transaction corresponding to a read command of the encoded compressed data (e.g., a single bus transaction to read a single compressed tile from the physical memory 324). The bus transaction may further indicate a VA of the encoded compressed tile. The bus protocol conversion component 354 may send the bus transaction to the SMMU 308 over the bus 305. The bus protocol conversion component 354 may further generate a separate bus transaction corresponding to a read command of the metadata associated with the encoded compressed data. The bus transaction may further indicate a VA of the metadata. The bus protocol conversion component 354 may send the bus transaction to the SMMU 308 over the bus 305.

The SMMU 308 may further communicate over the bus 330 with the memory controller 320, which may communicate over the bus 332 with the physical memory 324. The memory controller 320 may receive the encoded compressed data and corresponding metadata from the physical memory 324 over bus 332 (e.g., as separate bus transactions). The memory controller 320 may send the encoded compressed data and corresponding metadata to the SMMU 308 over bus 330 (e.g., as separate bus transactions). The SMMU 308 may send the encoded compressed data and corresponding metadata to the EU 306 over bus 305 (e.g., as separate bus transactions). The bus protocol conversion component 354 may convert the bus transaction(s) to the encoded compressed data and metadata and pass the encoded compressed data and metadata to the bus coding component 360. The bus coding component 360 may decode the encoded compressed data based on the control data included in the metadata. The bus coding component 360 may pass the compressed data and metadata to the BWC/D component 352. The BWC/D component 352 may decompress the compressed data based on the corresponding metadata to retrieve the original data (e.g., tile data).

As discussed above, in certain aspects, metadata including control data corresponding to encoded compressed data is communicated for storage by the SMMU 308 in physical memory 324. As discussed, this may provide power savings for both reading and writing data to physical memory 324. In certain aspects, as discussed, for each transaction (e.g., read or write) to physical memory 324, there is a transaction for the actual encoded compressed data, and a separate transaction for the corresponding metadata. The additional transaction for the metadata and need to store the metadata on physical memory 324 may require a larger physical memory 324 (e.g., taking up more physical space) and in some aspects may utilize additional power for accessing the physical memory 324.

Accordingly, certain aspects herein relate to storing the metadata including control data in an on-chip memory instead of the physical memory 324 (e.g., off-chip memory). Therefore, reads and writes of the metadata are performed with respect to the on-chip memory instead of the off-chip memory. Utilizing such an on-chip memory can advantageously reduce power consumption for reads/writes of metadata to the physical memory 324, as transactions with respect to the on-chip memory may be more power efficient. Further, the size of the physical memory 324 may be reduced, or the storage capacity used for other purposes, since metadata is not written to the physical memory 324. In addition, storing the metadata including control data in the on-chip memory still does not require sideband signaling or modification existing bus interfaces. In addition, storing the metadata including control data in the on-chip memory reduces the bandwidth used for communicating with the physical memory 324. It should be noted, that though use of the on-chip memory is described with respect to storing metadata including control data, one of skill in the art should recognize that, in some aspects, similar techniques may be utilized for storing metadata without control data (e.g., where bus encoding is not utilized), for storing control data alone (e.g., where bandwidth compression is not utilized), etc.

Figure 3C:
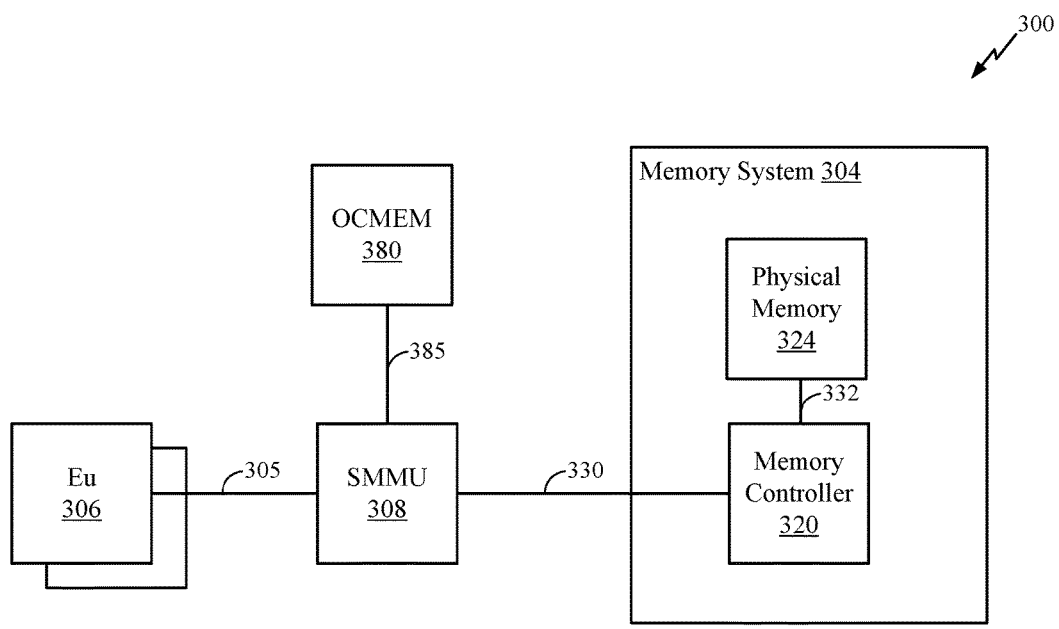
FIG. 3C illustrates a system including a memory system for communicating data between an electronic unit (EU) (e.g., of a system-on-chip (SoC)) and a physical memory, in accordance with certain aspects of the present disclosure.

In some aspects, the system 300 further includes one or more on-chip memories (e.g., system cache, instruction memory (IMEM), etc.) For example, FIG. 3C illustrates an example of the system 300 further including an on-chip memory (OCMEM) 380, in accordance with certain aspects of the present disclosure. The on-OCMEM 380 is separate from physical memory 324 (e.g., off-chip memory) and memory system 304. In some aspects, OCMEM 380 is on the same die or a packaged chip with the EUs 306 and SMMU 308.

As shown, OCMEM 380 is coupled by a bus 385 to SMMU 308. In some aspects, the bus 385 may be different than or the same as bus 305 or 330. Further, OCMEM 380 is shown external and separate from EUs 306 and SMMU 308. In certain aspects, OCMEM 380 is shared by multiple EUs 306. In certain aspects, there may be multiple OCMEMs 380 shared by multiple EUs 306.

In certain aspects, OCMEM 380 may reside internal to one or more EUs 306 or SMMU 308. For example, in some aspects, one or more EUs 306 may include its own separate OCMEM 380. In some such aspects, data for a single EU 306 may be accessible to only that EU 306, since other EUs 306 do not have access to the same OCMEM 380. In some aspects, even if an EU 306 includes its own OCMEM 380, other EUs 306 may have access to the OCMEM 380 (e.g., directly or indirectly).

As discussed previously, the EU 306 may have data to write to the physical memory 324. Where bandwidth compression is used, the BWC/D component 352 may apply a compression technique (e.g., tile based compression scheme for image data divided into tiles) to the data to write to the physical memory 324. The BWC/D component 352 may pass the compressed data to the bus coding component 360. Or where bandwidth compression is not used, data may be passed to the bus coding component 360 without compression. The bus coding component 360 may encode the data (e.g., compressed data or uncompressed data) (e.g., utilizing bus encoding, such as described herein). The bus coding component 360 may further generate control data for interpreting/decoding the encoded data. The bus coding component 360 further passes the control data and encoded data to the bus protocol conversion component 354.

The bus protocol conversion component 354 is configured to convert the encoded data to a bus transaction and send the encoded data as a bus transaction to the SMMU 308 for further communication to the physical memory 324. In addition to transmitting the actual encoded data to the SMMU 308, the bus protocol conversion component 354 may communicate the address information (e.g., VA) of where to write the encoded data to the SMMU 308 over the bus 305.

Further, the bus protocol conversion component 354 may generate and/or send metadata (e.g., control data, compression information, metadata including control data, etc.) about the encoded data to the SMMU 308 along with address information (e.g., VA) of where to write the metadata to the SMMU 308 over the bus 305. In some aspects, the bus protocol conversion component 354 includes the control data for decoding the encoded data received from the bus encoding component 360 in the metadata generated and sent to the SMMU 308.

In some aspects, the SMMU 308 may utilize the control data in the metadata to interpret the encoded data. The SMMU 308 may further translate the VA for storing the encoded data to a PA in the physical memory 324. The SMMU 308 may further communicate the encoded data to the memory controller 320 over the bus 330. The memory controller 320 may communicate the encoded data to the physical memory 324 and direct storage of the encoded data in the physical memory 324.

Further, in certain aspects, the SMMU 308 directs storage of the metadata and corresponding VA for the metadata in the OCMEM 380. For example, in some aspects, the SMMU 308 communicates the metadata and corresponding VA to the OCMEM 380 via the bus 385. In certain aspects, the SMMU 308 stores the VA and metadata as a corresponding pair of data in the OCMEM 380 in any available location in OCMEM 380. Accordingly, retrieving the metadata from OCMEM 380 based on the VA, in some aspects, may require the SMMU 308 to search the OCMEM 380 for the appropriate VA. In some aspects, the SMMU 308 translates the VA to a PA (e.g., using a hash function, etc.) of the OCMEM 380 and stores the metadata in the corresponding OCMEM 380. In some aspects, the VA generated by EU 306 is the same as it would be for storing metadata in the physical memory 324, and the EU 306 is unaware of where the metadata is stored. In some aspects, the VA generated by EU 306 is different than it would be for storing metadata in the physical memory 324, and the EU 306 is aware of where the metadata is stored.

In some aspects, the same or another EU 306 may read the encoded data from the physical memory 324. In particular, as discussed, the bus protocol conversion component 354 may generate a bus transaction corresponding to a read command of the encoded data (e.g., a single bus transaction to read a single compressed tile from the physical memory 324). The bus transaction may further indicate a VA of the encoded data. The bus protocol conversion component 354 may send the bus transaction to the SMMU 308 over the bus 305. The bus protocol conversion component 354 may further generate a separate bus transaction corresponding to a read command of the metadata associated with the encoded data. The bus transaction may further indicate a VA of the metadata. The bus protocol conversion component 354 may send the bus transaction to the SMMU 308 over the bus 305.

The SMMU 308 may further communicate over the bus 330 with the memory controller 320, which may communicate over the bus 332 with the physical memory 324. The memory controller 320 may receive the encoded data from the physical memory 324 over bus 332. The memory controller 320 may send the encoded data to the SMMU 308 over bus 330.

The SMMU 308 may further communicate over the bus 385 with the OCMEM 380. The SMMU 308 may receive the metadata corresponding to the encoded data over the bus 385 from the OCMEM 380. In some aspects, the SMMU 308 searches the OCMEM 380 for a corresponding VA. In some aspects, the SMMU 308 translates the VA to a PA and retrieves the metadata from the corresponding PA in the OCMEM 380.

The SMMU 308 may send the encoded data and corresponding metadata to the EU 306 over bus 305 (e.g., as separate bus transactions). The bus protocol conversion component 354 may convert the bus transaction(s) to the encoded data and metadata and pass the encoded data and metadata to the bus coding component 360. The bus coding component 360 may decode the encoded data based on the control data included in the metadata. In some aspects, where the data comprises compressed data, the bus coding component 360 may pass the compressed data and metadata to the BWC/D component 352. The BWC/D component 352 may decompress the compressed data based on the corresponding metadata to retrieve the original data (e.g., tile data).

In some aspects, the OCMEM 380 has a size sufficient to store metadata corresponding to a single frame of image data (e.g., 132227 bytes for a 5488×4112 image, 48600 bytes for a 3840×2160 pixel image, 12150 bytes for a 1920×1080 pixel image, etc., assuming 1 byte of meta data for every 256 byte transaction in a 4:2:0 image).

Figure 4:
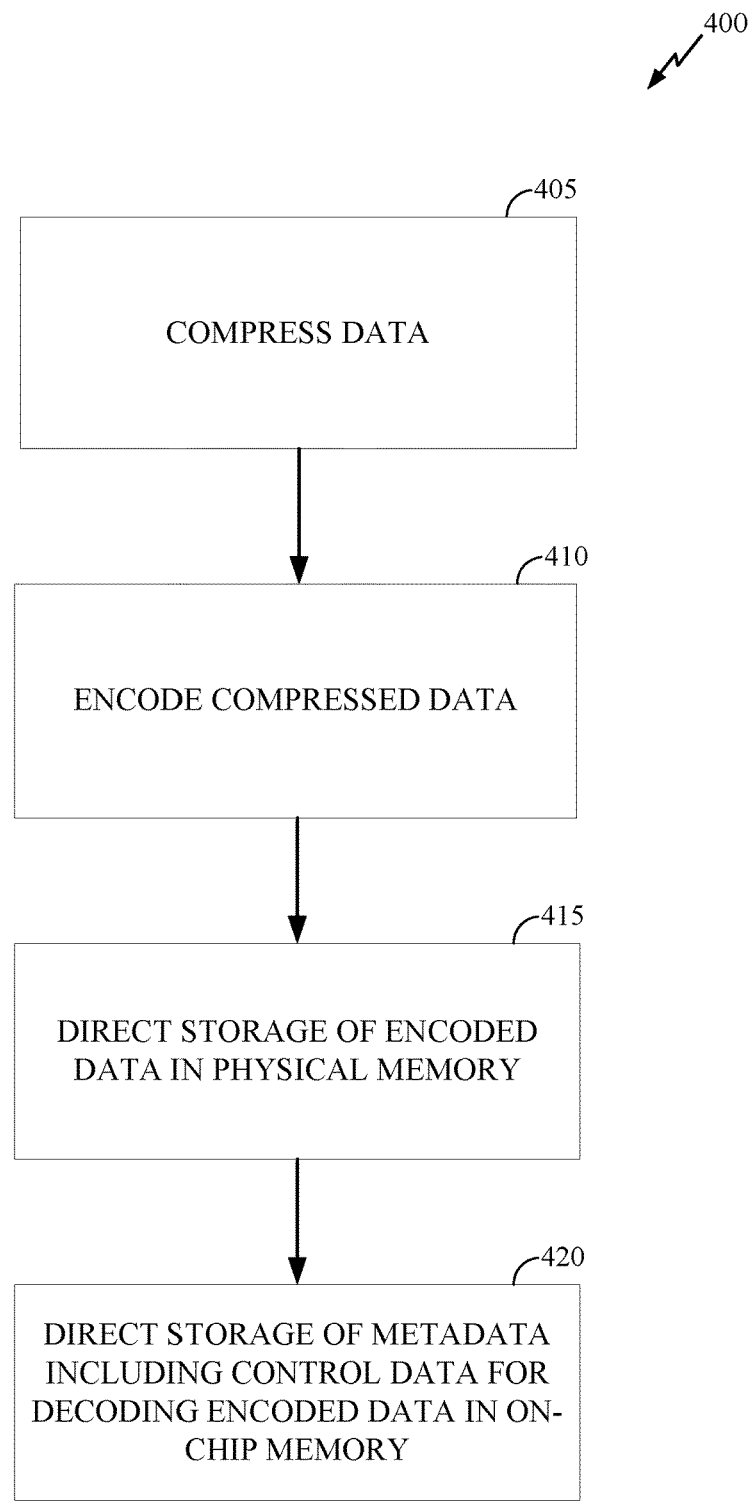
FIG. 4 illustrates example operations for communicating data between an electronic unit (EU) (e.g., of a system-on-chip (SoC)) and a physical memory, in accordance with certain aspects of the present disclosure.

FIG. 4 illustrates example operations for communicating data between an electronic unit (EU) (e.g., of a system-on-chip (SoC)) and a physical memory, in accordance with certain aspects of the present disclosure.

At 405, the EU (e.g., EU 306) compresses data (e.g., image data). For example, a BWC/D component (e.g., BWC/D component 352) of the EU may apply bandwidth compression to the data to form image data. In some aspects, the BWC/D component may also generate metadata corresponding to the compressed data.

At 410, the EU encodes the compressed data. For example, a bus coding component (e.g., bus coding component 360) of the EU applies a bus encoding to reduce power for transmitting the compressed data along one or more buses. In some aspects, the bus encoding component of the EU further generates control data corresponding to the encoded compressed data.

At 415, the EU directs storage of the encoded data in a physical memory (e.g., physical memory 324) that is off-chip from the EU. For example, a bus protocol conversion component (e.g., bus protocol conversion component 354) may generate a bus transaction for writing the encoded compressed data in the physical memory. The bus protocol conversion component may send the bus transaction over a bus to a SMMU (e.g., SMMU 308). Further, the SMMU generates and sends a bus transaction for writing the encoded compressed data to a memory controller (e.g., memory controller 320). The memory controller generates and sends a bus transaction for writing the encoded compressed data to the physical memory. The physical memory stores the encoded compressed data.

At 420, the EU directs storage of the metadata in an on-chip memory (e.g., OCMEM 380) that is on the same chip as the EU. For example, the EU directs storage of the metadata at the same time as directing storage of the encoded data. For example, a bus protocol conversion component (e.g., bus protocol conversion component 354) may generate a bus transaction for writing the metadata in the on-chip memory. In some aspects, the bus protocol conversion component generates the metadata and includes the control data in the metadata. The bus protocol conversion component may send the bus transaction over a bus to a SMMU (e.g., SMMU 308). Further, the SMMU generates and sends a bus transaction for writing the metadata to the on-chip memory, which stores the metadata.

Figure 5:
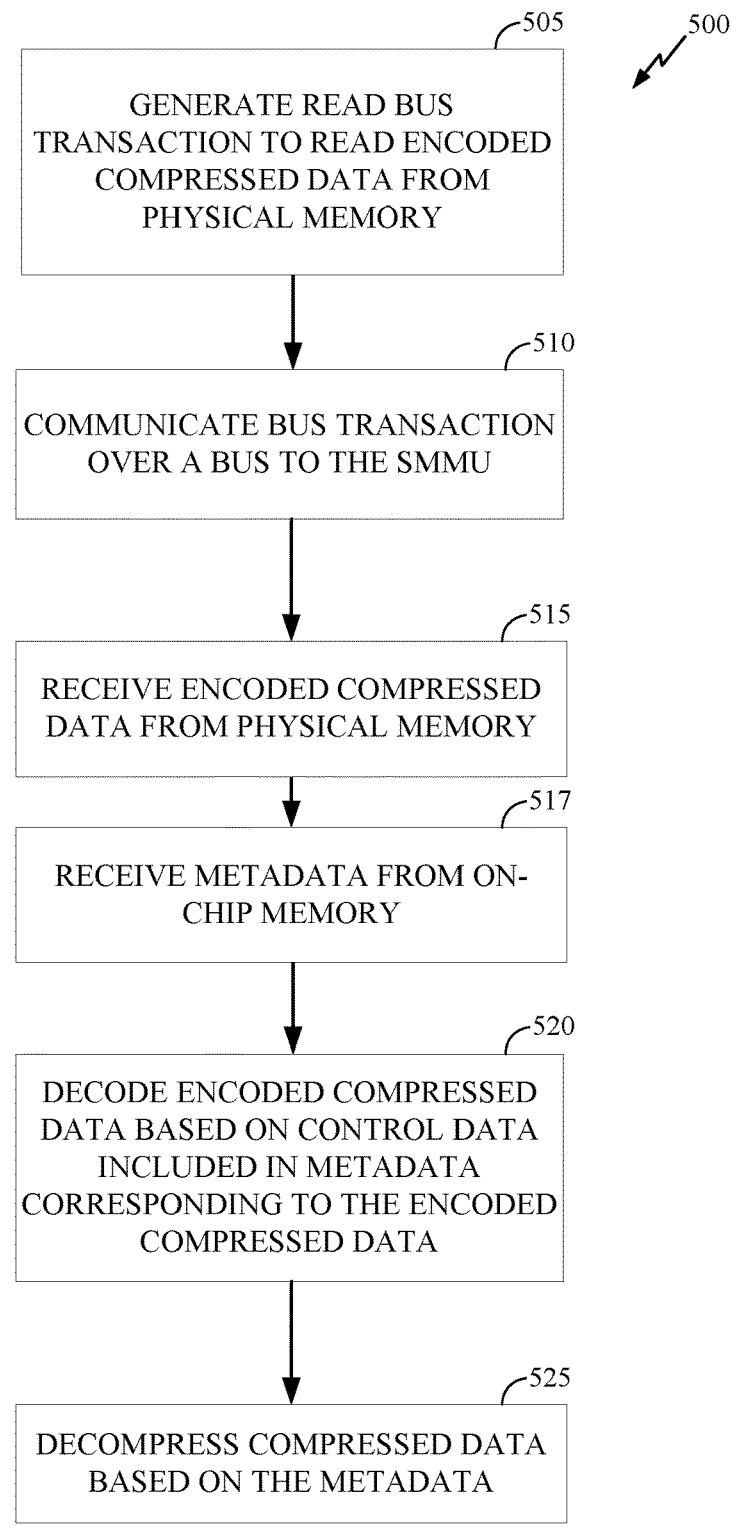
FIG. 5 illustrates example operations for communicating data between an electronic unit (EU) (e.g., of a system-on-chip (SoC)) and a physical memory, in accordance with certain aspects of the present disclosure.

FIG. 5 illustrates example operations for communicating data between an electronic unit (EU) (e.g., of a system-on-chip (SoC)) and a physical memory, in accordance with certain aspects of the present disclosure.

At 505, the EU (e.g., EU 306) generates a read transaction to read encoded compressed data from a physical memory (e.g., physical memory 324). For example, a bus protocol conversion component (e.g., bus protocol conversion component 354) of the EU may generate bus transactions for reading the encoded compressed data and corresponding metadata from the physical memory and an on-chip memory (e.g., OCMEM 380), respectively.

At 510, the EU communicates the bus transactions over a bus to a SMMU. For example, the bus protocol conversion component may send the bus transactions over a bus to a SMMU (e.g., SMMU 308). Further, the SMMU generates and sends a bus transaction for reading the encoded compressed data to a memory controller (e.g., memory controller 320). The memory controller generates and sends a bus transaction for reading the encoded compressed data to the physical memory. The physical memory retrieves the stored encoded compressed data. Further, the SMMU generates and sends a bus transaction for reading the metadata to the OCMEM 380, which retrieves the stored metadata.

At 515, the EU receives the encoded compressed data from the physical memory. For example, the memory controller receives the encoded compressed data from the physical memory. The memory controller generates and sends a bus transaction including the compressed data to the SMMU. The SMMU generates and sends a bus transaction including the encoded compressed data to the bus protocol conversion component.

At 517, the EU receives the metadata from the on-chip memory. The SMMU generates and sends a bus transaction including the metadata to the bus protocol conversion component.

At 520, the EU decodes the encoded compressed data based on control data included in the metadata corresponding to the encoded compressed data. For example, the bus protocol conversion component passes the encoded compressed data and metadata to a bus coding component (e.g., bus coding component 360) of the EU. The bus coding component decodes the encoded compressed data based on control data included in the metadata.

At 525, the EU decompresses the compressed data based on the metadata. For example, the bus coding component passes the decoded compressed data and metadata to a BWC/D component (e.g., BWC/D component 352) of the EU. The BWC/D component may decompress the compressed data based on the metadata to retrieve the uncompressed data.

In some configurations, the term(s) 'communicate,' 'communicating,' and/or 'communication' may refer to 'receive,' 'receiving,' 'reception,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. A method of communicating data between an electronic unit (EU) of a system-on-chip (SoC) and a dynamic random access memory (DRAM), the method comprising:
    compressing data at the EU to generate compressed data;
    generating information used for decompressing the compressed data;

encoding the compressed data at the EU into encoded data comprising encoded compressed data to minimize a hamming distance between bits of the compressed data;
generating control data for decoding the encoded data at the EU, wherein the control data is different than the information used for decompressing the compressed data;
directing storage of the encoded data in the DRAM;
directing storage of both the information used for decompressing the compressed data and the control data for decoding the encoded data in an on-chip memory separate from the DRAM, wherein the on-chip memory is on a same chip as the EU;
directing reading of the encoded data from the DRAM; and
directing reading of the control data from the on-chip memory, wherein the encoded data remains encoded during transfer between the EU and the DRAM.

2. The method of claim 1, wherein the control data comprises one or more of an indication of whether bus inversion has been applied to the compressed data and a type of encoding applied to the compressed data.

3. The method of claim 1, wherein directing storage of the encoded data in the DRAM comprises directing a write transaction of the encoded data to the DRAM, the write transaction comprising a plurality of beats, and wherein the control data indicates whether each beat of the plurality of beats is encoded or not.

4. The method of claim 1, wherein directing storage of the encoded data comprises:
converting encoded data to a bus transaction; and
sending the bus transaction to a system memory management unit (SMMU) over a bus interface, wherein the SMMU interfaces with a DRAM controller over the bus interface, and wherein the DRAM controller interfaces with the DRAM over the bus interface.

5. A system-on-chip (SoC) comprising:
an on-chip memory; and
at least one processor configured to:
compress data to generate compressed data;
encode the compressed data into encoded data comprising encoded compressed data to minimize a hamming distance between bits of the compressed data;
generate control data for decoding the encoded data;
generate information used for decompressing the compressed data, wherein the control data is different than the information used for decompressing the compressed data;
direct storage of the encoded data in a dynamic random access memory (DRAM);
direct storage of both the information used for decompressing the compressed data and the control data for decoding the encoded data in the on-chip memory separate from the DRAM;
direct reading of the encoded data from the DRAM; and
direct reading of the control data from the on-chip memory, wherein the encoded data remains encoded during transfer between the EU and the DRAM.

6. The SoC of claim 5, wherein the control data comprises one or more of an indication of whether bus inversion has been applied to the compressed data and a type of encoding applied to the compressed data.

7. The SoC of claim 5, wherein to direct storage of the encoded data in the DRAM comprises to direct a write transaction of the encoded data to the DRAM, the write transaction comprising a plurality of beats, and wherein the control data indicates whether each beat of the plurality of beats is encoded or not.

8. The SoC of claim 5, wherein to direct storage of the encoded data comprises to:
convert encoded data to a bus transaction; and
send the bus transaction to a system memory management unit (SMMU) over a bus interface, wherein the SMMU interfaces with a DRAM controller over the bus interface, and wherein the DRAM controller interfaces with the DRAM over the bus interface.

9. An electronic unit (EU) of a system-on-chip (SoC) comprising:
means for compressing data at the EU to generate compressed data;
means for generating information used for decompressing the compressed data;
means for encoding the compressed data at the EU into encoded data to minimize a hamming distance between bits of the compressed data;
means for generating control data for decoding the encoded data at the EU, wherein the control data is different than the information used for decompressing the compressed data;
means for directing storage of the encoded data in the DRAM;
means for directing storage of both the information used for decompressing the compressed data and the control data for decoding the encoded data in an on-chip memory separate from the DRAM, wherein the on-chip memory is on a same chip as the EU;
means for directing reading of the encoded data from the DRAM; and
means for directing reading of the control data from the on-chip memory, wherein the encoded data remains encoded during transfer between the EU and the DRAM.

10. The EU of claim 9, wherein the control data comprises one or more of an indication of whether bus inversion has been applied to the compressed data and a type of encoding applied to the compressed data.

11. The EU of claim 9, wherein means for directing storage of the encoded data in the DRAM comprises means for directing a write transaction of the encoded data to the DRAM, the write transaction comprising a plurality of beats, and wherein the control data indicates whether each beat of the plurality of beats is encoded or not.

12. The EU of claim 9, wherein means for directing storage of the encoded data comprises:
means for converting encoded data to a bus transaction; and
means for sending the bus transaction to a system memory management unit (SMMU) over a bus interface, wherein the SMMU interfaces with a DRAM controller over the bus interface, and wherein the DRAM controller interfaces with the DRAM over the bus interface.

13. A non-transitory computer readable medium having instructions stored thereon for causing an electronic unit (EU) of a system-on-chip (SoC) to perform a method of communicating data between the EU and a dynamic random access memory (DRAM), the method comprising:
compressing data at the EU to generate compressed data;
generating information used for decompressing the compressed data;

encoding the compressed data at the EU into encoded data comprising encoded compressed data to minimize a hamming distance between bits of the compressed data;

generating control data for decoding the encoded data at the EU, wherein the control data is different than the information used for decompressing the compressed data;

directing storage of the encoded data in the DRAM;

directing storage of both the information used for decompressing the compressed data and the control data for decoding the encoded data in an on-chip memory separate from the DRAM, wherein the on-chip memory is on a same chip as the EU;

directing reading of the encoded data from the DRAM; and directing reading of the control data from the on-chip memory, wherein the encoded data remains encoded during transfer between the EU and the DRAM.

14. The non-transitory computer readable medium of claim 13, wherein the control data comprises one or more of an indication of whether bus inversion has been applied to the compressed data and a type of encoding applied to the compressed data.

15. The non-transitory computer readable medium of claim 13, wherein directing storage of the encoded data in the DRAM comprises directing a write transaction of the encoded data to the DRAM, the write transaction comprising a plurality of beats, and wherein the control data indicates whether each beat of the plurality of beats is encoded or not.

16. The non-transitory computer readable medium of claim 13, wherein directing storage of the encoded data comprises:

converting encoded data to a bus transaction; and sending the bus transaction to a system memory management unit (SMMU) over a bus interface, wherein the SMMU interfaces with a DRAM controller over the bus interface, and wherein the DRAM controller interfaces with the DRAM over the bus interface.

* * * * *